United States Patent [19]
Griffith et al.

[11] Patent Number: 6,133,764
[45] Date of Patent: Oct. 17, 2000

[54] COMPARATOR CIRCUIT AND METHOD

[75] Inventors: Richard S. Griffith, Chandler; Robert L. Vyne; Thomas A. Somerville, both of Tempe, all of Ariz.

[73] Assignee: Motorola, Inc., Schaumburg, Ill.

[21] Appl. No.: 09/238,773

[22] Filed: Jan. 27, 1999

[51] Int. Cl.[7] .................................................. H03K 5/22
[52] U.S. Cl. .......................................................... 327/65
[58] Field of Search ................................. 327/53, 73, 66, 327/65, 72, 54, 63, 67; 330/255, 260, 253, 288, 315

[56] References Cited

U.S. PATENT DOCUMENTS

| | | | |
|---|---|---|---|
| 4,670,671 | 6/1987 | De Weck | 327/68 |
| 4,710,793 | 12/1987 | Gray | 357/44 |
| 4,970,412 | 11/1990 | Jarrett | 327/80 |
| 5,311,115 | 5/1994 | Archer | 323/315 |
| 5,401,987 | 3/1995 | Hiser et al. | 257/204 |
| 5,412,336 | 5/1995 | Barrett, Jr. et al. | 327/560 |
| 5,451,909 | 9/1995 | Fattaruso | 330/311 |
| 5,565,375 | 10/1996 | Hiser et al. | 437/57 |
| 5,625,313 | 4/1997 | Etoh | 327/486 |
| 5,909,136 | 6/1999 | Kimura | 327/356 |
| 5,990,742 | 11/1999 | Suzuki | 330/253 |

*Primary Examiner*—Tuan T. Lam
*Assistant Examiner*—Hiep Nguyen
*Attorney, Agent, or Firm*—Lanny L. Parker

[57] ABSTRACT

A comparator circuit (10) with hysteresis having transistors with the same threshold voltage and a method for comparing input signals. The comparator circuit (10) includes a current mirror (11) coupled to a common electrode differential pair (12) and to a feedback circuit (13). The current mirror (11) has a large output impedance and provides a plurality of output currents ($I_{21}$, $I_{26}$, $I_{31}$). Some ($I_{21}$, $I_{26}$) of the currents are transmitted to the common electrode differential pair and one ($I_{31}$) of the currents is transmitted to the feedback circuit (13). The output currents ($I_{21}$, $I_{26}$, $I_{31}$) are modulated to generate positive feedback signals that control changing the output state of the comparator circuit (10) as well as provide hysteresis for the comparator circuit (10).

17 Claims, 2 Drawing Sheets

10

50

100

140

COMPARATOR CIRCUIT AND METHOD

BACKGROUND OF THE INVENTION

The present invention relates, in general, to comparator circuits and, more particularly, to comparator circuits having hysteresis.

Comparator circuits are used in a wide range of applications including battery protection circuitry, switching circuitry, control circuitry, etc. Typically, comparator circuits are comprised of a differential amplifier having a reference input terminal coupled for receiving a reference potential and an input terminal coupled for receiving a time-varying input signal. The reference potential is often referred to as the setpoint. The output signal of the comparator circuit changes state when the amplitude of the time-varying input signal rises above or falls below the reference potential.

Comparator circuits used in noisy environments also include hysteresis circuitry to prevent the output signal of the comparator circuit from changing states when large transient voltage signals are superimposed on the time-varying input signal. A common technique for providing hysteresis is to form a feedback loop from the output to the input of the differential amplifier. Once the output signal changes state in response to the input signal exceeding the reference potential, the feedback loop reduces the reference potential. Hence, the input signal must decrease to a value lower than the reduced reference potential to switch the output state of the differential amplifier back to its original operating state.

Drawbacks of these prior art comparator circuits include slow output signal switching speeds when the setpoint is reached and variation in the setpoint with variation in power supply voltage. In addition, these prior art comparator circuits consume a large amount of power and area.

Accordingly, it would be advantageous to have a comparator circuit that provides a fast comparison when a defined setpoint is reached and is suitable for use in low power applications. Other desirable features of the comparator circuit include the presence of hysteresis circuitry to prevent erroneous trip point indications and high power supply rejection properties to prevent variations in the setpoint. It would be of further advantage for the comparator circuit to be manufacturable in an integrated circuit manufacturing process and to be power and area efficient.

DETAILED DESCRIPTION OF THE DRAWINGS

Generally, the present invention provides a comparator circuit and a method for comparing a plurality of voltages by sensing a current. The comparator circuit has a current mirror having one type of transistor to perform low side sensing and another type of transistor to perform high side sensing. In addition, the comparator circuit has adjustable hysteresis that is independent of the threshold voltage.

Figure 1:
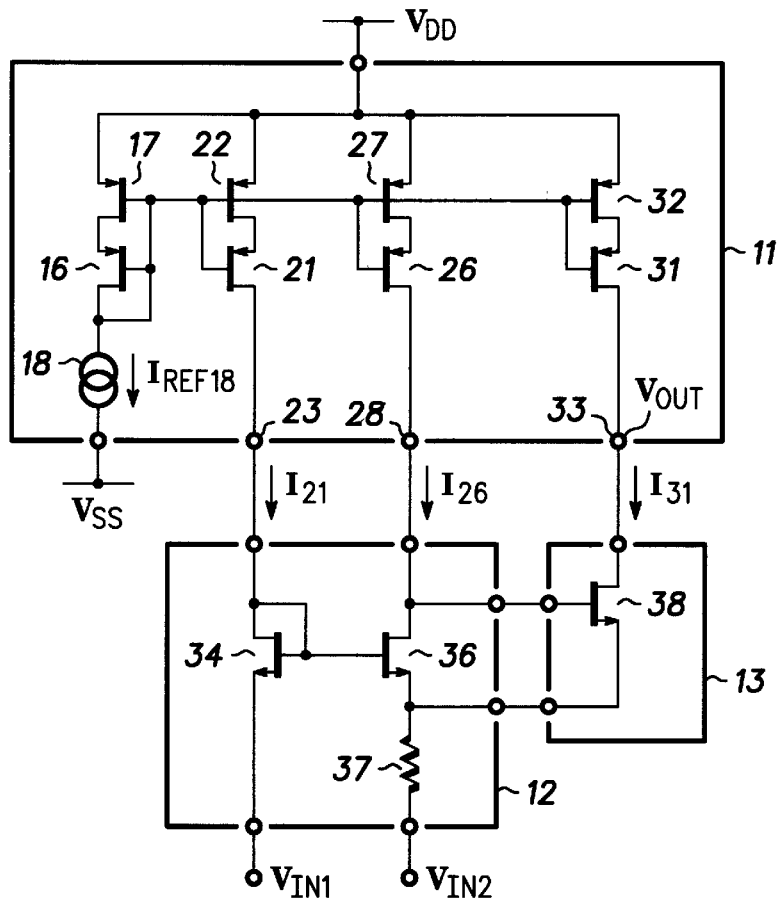
FIG. 1 is a schematic diagram of a comparator circuit in accordance with a first embodiment of the present invention.

FIG. 1 is a schematic diagram of a comparator circuit 10 in accordance with a first embodiment of the present invention. Comparator circuit 10 includes a current mirror 11 connected to a common control-electrode differential pair 12 and to a feedback circuit 13. In accordance with the first embodiment of the present invention, current mirror 11 includes four pairs of cascode connected insulated gate field effect transistors. The first pair of cascode connected transistors is comprised of P-channel insulated gate field effect transistors 16 and 17. The gate electrodes of transistors 16 and 17 are commonly connected to each other and to the drain electrode of transistor 16. The drain electrode of transistor 16 is coupled to a source of operating potential, $V_{SS}$, via a current source 18. In addition, the source electrode of transistor 16 is connected to the drain electrode of transistor 17. The source electrode of transistor 17 is coupled for receiving a source of operating potential such as for example, a voltage $V_{DD}$. Current source 18 supplies a current indicated by the arrow labeled $I_{REF18}$. It should be understood that the gate electrode of a field effect transistor is also referred to as a control electrode and the source and drain electrodes are also referred to as current carrying electrodes.

The second pair of cascode connected transistors is comprised of P-channel insulated gate field effect transistors 21 and 22. The gate electrodes of transistors 21 and 22 are commonly connected to each other and to the gate electrodes of transistors 16 and 17. The drain electrode of transistor 21 is connected to an output terminal 23 of current mirror 11. The source electrode of transistor 21 is connected to the drain electrode of transistor 22 and the source electrode of transistor 22 is coupled for receiving a source of operating potential such as, for example, $V_{DD}$.

The third pair of cascode connected transistors is comprised of P-channel insulated gate field effect transistors 26 and 27. The gate electrodes of transistors 26 and 27 are commonly connected to each other and to the gate electrodes of transistors 16, 17, 21, and 22. The drain electrode of transistor 26 is connected to an output terminal 28 of current mirror 11. The source electrode of transistor 26 is connected to the drain electrode of transistor 27 and the source electrode of transistor 27 is coupled for receiving a source of operating potential such as, for example, $V_{DD}$.

The fourth pair of cascode connected transistors is comprised of P-channel insulated gate field effect transistors 31 and 32. The gate electrodes of transistors 31 and 32 are commonly connected to each other and to the gate electrodes of transistors 16, 17, 21, 22, 26, and 27. The drain electrode of transistor 31 is connected to an output terminal 33 of current mirror 11. The source electrode of transistor 31 is connected to the drain electrode of transistor 32 and the source electrode of transistor 32 is coupled for receiving a source of operating potential such as, for example, $V_{DD}$. Although the source electrodes of transistors 17, 22, 27, and 32 are described as being coupled for receiving a source of operating potential, preferably, the source electrodes of transistors 17, 22, 27, and 32 are commonly coupled together and for receiving a potential from the same source of operating potential.

An important feature of current mirror 11 is that the semiconductor devices can all have the same threshold voltage. In other words, the transistors that comprise current mirror 11 are manufactured using a semiconductor process having the capability of manufacturing semiconductor devices that have the same threshold voltage, i.e., a single threshold voltage. This advantage makes this technique compatible with standard Complementary Metal Oxide Semiconductor (CMOS) logic processes having a minimum number of masking steps and therefore a low cost. This feature is realized by sizing transistors 17, 22, 27, and 32 to operate in the linear region and sizing transistors 16, 21, 26, and 31 to operate in the saturation region. Sizing the transistors to operate in these regions improves the output impedance compared with a simple current mirror, yet does not degrade the output voltage swing of current mirror 11. The sizes of the transistors are selected such that the width-to-length ratio of transistors 17, 22, 27, and 32 $(W/L)_L$ is small enough to allow these transistors to operate in the linear region, and the width-to-length ratio of transistors 16, 21, 26, and 31 $(W/L)_S$ is large enough to allow these transistors to operate in the saturation region. Because transistors 17, 22, 27, and 32 have the same unit size and operate in the linear region, their width-to-length ratio is denoted $(W/L)_L$. Similarly, because transistors 16, 21, 26, and 31 have the same unit size and operate in the saturation region, their width-to-length ratio is denoted by $(W/L)_S$. Transistors 22, 27, 32, 21, 26, and 31 can then be scaled relative to transistors 16 and 17 to give the desired output current, i.e., they can be scaled to provide output currents having a value that are scaled to be a multiple of the unit current value. The common control gate cascode configured transistors resemble resistor degenerated current sources in which transistors 17, 22, 27, and 32 provide a local current-to-voltage feedback.

To further illustrate the design of current mirror 11, transistors 17 and 22 are set to the same size and have a width-to-length ratio $(W/L)_L$ and transistors 16 and 21 are set to the same size and have a width-to-length ratio $(W/L)_S$. Since transistors 17 and 22 operate in the linear region, their currents are given by equation (eqt.) 1 as:

$$I = \mu * C_{ox} * \left(\frac{W}{L}\right)_L * \left[V_{GS22} - V_T - \left(\frac{V_{DS22}}{2}\right)\right] * V_{DS22} \qquad \text{eqt. 1}$$

where:

$\mu$ is the carrier mobility;

$C_{OX}$ is the gate oxide capacitance of transistors 17 and 22;

$(W/L)_L$ is the width-to-length ratios of transistors 17 and 22;

$V_{GS22}$ is the gate-to-source voltage of transistors 17 and 22;

$V_T$ is the threshold voltage of transistors 17 and 22; and $V_{DS22}$ is the drain-to-source voltage of transistors 17 and 22.

Since transistors 16 and 21 operate in the saturated region, their currents are given by:

$$I = \frac{\mu * C_{ox}}{2} * \left(\frac{W}{L}\right)_S * [V_{GS21} - V_T]^2 \qquad \text{eqt. 2}$$

where:

$\mu$ is the carrier mobility;

$C_{OX}$ is the gate oxide capacitance of transistors 16 and 21;

$(W/L)_S$ is the width-to-length ratios of transistors 16 and 21;

$V_{GS21}$ is the gate-to-source voltage of transistors 16 and 21; and $V_T$ is the threshold voltage of transistors 16 and 21.

From the loop equation:

$$V_{GS22} = V_{GS21} + V_{DS22} \qquad \text{eqt. 3}$$

where:

$$V_{GS21} = \sqrt{\frac{2*I}{\mu * C_{ox} * \left(\frac{W}{L}\right)_{21}}}$$

Combining the current and loop equations yields:

$$V_{DS22} = \left[\sqrt{1 + \frac{\left(\frac{W}{L}\right)_S}{\left(\frac{W}{L}\right)_L}} - 1\right] * \left[\sqrt{\frac{2*I}{\mu * C_{ox} * \left(\frac{W}{L}\right)_S}}\right] \qquad \text{eqt. 4}$$

Substituting the value of $V_{DS}$ into the loop equation yields:

$$V_{GS22} = \sqrt{\frac{2*I\left(\left(\frac{W}{L}\right)_L + \left(\frac{W}{L}\right)_S\right)}{\mu * C_{ox}\left(\frac{W}{L}\right)_L * \left(\frac{W}{L}\right)_S}} + V_T \qquad \text{eqt. 5}$$

The minimum switching voltage is given as:

$$(V_{DD} - V_{Out})_{\min} = V_{DS22} + V_{GS21} - V_T \qquad \text{eqt. 6}$$

$$= \sqrt{\frac{2*I_D\left[\left(\frac{W}{L}\right)_L + \left(\frac{W}{L}\right)_S\right]}{\mu C_{ox} * \left(\frac{W}{L}\right)_L * \left(\frac{W}{L}\right)_S}}$$

The output resistance of transistors operating in the linear region is given as:

$$r_{o22} = \frac{1}{\mu * C_{ox} * \left(\frac{W}{L}\right)_L * (V_{GS22} - V_T - V_{DS22})} \qquad \text{eqt. 7}$$

$$= \frac{1}{\left(\frac{W}{L}\right)_L * \sqrt{\frac{2*I*\mu*C_{ox}}{\left(\frac{W}{L}\right)_S}}}$$

Therefore, the output resistance of one leg or branch of current mirror 11 is given as:

$$r_{out} = \frac{V_{out}}{I_{21}} = ro_{21} * (1 + gm_{21} * ro_{22}) \qquad \text{eqt. 8}$$

$$\approx ro_{21} * \left[\frac{1 + \sqrt{2*I*\mu*C_{ox}*\left(\frac{W}{L}\right)_S}}{\sqrt{\frac{2*I*\mu*C_{ox}}{\left(\frac{W}{L}\right)_S}}} * \frac{1}{\left(\frac{W}{L}\right)_L}\right]$$

-continued $$r_{out} = ro_{21}\left[1 + \frac{\left(\frac{W}{L}\right)_S}{\left(\frac{W}{L}\right)_L}\right] \qquad \text{eqt. 9}$$

From eqt. 9, those skilled in the art will realize that currents $I_{21}$, $I_{26}$, and $I_{31}$ can easily be made to vary less than one percent per volt by adjusting the ratio of $(W/L)_S$ to $(W/L)_L$.

The common control-electrode differential pair 12 portion of comparator circuit 10 includes N-channel enhancement mode insulated gate field effect transistors 34 and 36 whose gate electrodes are commonly connected to each other. Because the gate electrodes of transistors 34 and 36 are commonly connected to each other, the circuit is also referred to as a common-gate differential pair. Transistor 34 is connected in a diode configuration, wherein its gate electrode is connected to its drain electrode. The commonly connected gate and drain electrodes of transistor 34 are connected to current mirror output terminal 23 and receive a current $I_{21}$. The source electrode of transistor 34 is coupled for receiving a first input signal, $V_{IN1}$.

The drain electrode of transistor 36 is connected to current mirror output terminal 28 and receives a current $I_{26}$. The source electrode of transistor 36 is connected to a first terminal of a resistor 37. The second terminal of resistor 37 is coupled for receiving a second input signal $V_{IN2}$.

The feedback circuit 13 of comparator 10 is comprised of an N-channel enhancement mode field effect transistor 38. The drain electrode of transistor 38 is connected to current mirror output electrode 33 and the source electrode is commonly connected to the source electrode of transistor 36 and to the first terminal of resistor 37 and receives current $I_{31}$. The gate electrode of transistor 38 is commonly connected to current mirror output terminal 28 and to the drain electrode of transistor 36.

In operation, current mirror 11 provides constant currents $I_{21}$, $I_{26}$, and $I_{31}$ to common control-electrode differential pair 12 and feedback circuit 13. When voltages $V_{IN1}$ and $V_{IN2}$ are equal, transistors 34 and 38 conduct currents $I_{21}$ and $I_{31}$, respectively, and transistor 36 is off and does not conduct a current, i.e., current $I_{26}$ is zero. Because transistor 36 is off, the voltage at the gate of transistor 38 is approximately equal to $V_{DD}$. As voltage $V_{IN2}$ is lowered to a voltage value less than a value equal to the difference between voltage $V_{IN1}$, and the voltage across resistor 37, $V_{R37}$, current begins to flow in transistor 36. In other words, transistor 36 begins to conduct current when $$V_{IN2} < V_{IN1} - V_{R37} \qquad \text{eqt. 10}$$

where
$V_{R37} = I_{31} * R_{37}$; and
$R_{37}$ the resistance of resistor 37.

As current $I_{26}$ begins to flow, the voltage at the gate of transistor 38 falls enough to allow transistor 36 to operate in the saturation region, i.e., the saturated value of current $I_{26}$ flows. At the threshold point, currents $I_{26}$ and $I_{31}$ flow through resistor 37 and the voltages at the gates of transistors 34, 36, and 38 are equal. The positive threshold point VTR+ occurs when the differential voltage $(V_{IN1}-V_{IN2})$ just equals a value of the product of the resistance value of resistor 37 and the sum of currents $I_{26}$ and $I_{31}$. When the voltage at the gate of transistor 38 drops just below the voltage at the gate of transistor 36, transistor 38 starts to turn off, which decreases the voltage drop across resistor 37. The decrease in voltage drop across resistor 37 lowers the voltage at the source of transistor 36 and helps to turn on transistor 36 even further. The act of transistor 36 turning on causes transistor 38 to turn off, which makes transistor 36 turn on even harder. This is called positive feedback. The positive feedback causes transistor 38 to rapidly turn off, resulting in a logic transition from a logic low to a logic high at terminal 33.

In other words, output voltage $V_{OUT}$ at terminal 33 changes logic states at the positive threshold point $V_{TR+}$, i.e., when $$V_{IN1} - V_{IN2} = (I_{26} + I_{31}) * R_{37} \qquad \text{eqt. 11}$$

The point at which the output voltage changes from a logic low voltage value to a logic high voltage value is also referred to as a positive transition voltage.

When voltage $V_{IN2}$ rises to within a value equal to the voltage $V_{IN1}$ minus a voltage equal to the product of current $I_{26}$ and the value of resistor 37, transistor 36 begins to turn off, causing the voltage at the gate of transistor 38 to rise. As the gate voltage of transistor 38 rises, transistor 38 begins to conduct current which adds to the voltage drop across transistor 37 and further turns off transistor 36. This positive feedback causes the output voltage $V_{OUT}$ to undergo a rapid transition from a logic high to a logic low. In this state, the current through resistor 37 is reduced from a value equal to the sum of currents $I_{26}$ and $I_{31}$ to a value equal to current $I_{26}$.

To reverse the state of output voltage $V_{OUT}$, input voltage $V_{IN2}$ is increased to a value greater than the difference between input voltage $V_{IN1}$, and the product of current I26 and the value of resistor 37, i.e., $V_{IN1} - I_{26} * R_{37}$.

The point at which the output voltage changes from a logic high voltage value to a logic low voltage value is also referred to as a negative threshold point or a negative transition voltage, $V_{TR-}$. This voltage is given as:

$$V_{TR-} = V_{IN1} - V_{IN2} = I_{26} * R_{37} \qquad \text{eqt. 12}$$

When input voltage $V_{IN2}$ rises, transistor 36 starts to turn off, which causes the voltage at the gate of transistor 38 to increase. As transistor 38 begins to conduct, transistor 36 is turned off more rapidly causing transistor 38 to turn on harder. This positive feedback mechanism causes the voltage at node 33 to make a rapid transition from $V_{DD}$ to $V_{IN2}$ at the negative threshold point $V_{TR-}$.

The hysteresis voltage, $V_{HYS}$, of comparator circuit 10 is given by:

$$V_{HYS}(V_{TR+}) - (V_{TR-}) = I_{31} * R_{37} \qquad \text{eqt. 13}$$

It should be understood that the equations for threshold points $V_{TR+}$ and $V_{TR-}$ have been derived assuming that the gate-source voltages of transistors 34 and 36 are equal at threshold points $V_{TR+}$ and $V_{TR-}$. An advantage in having these voltages equal at the threshold points is that the absolute values and the temperature coefficients of these voltages can be controlled by the selection of the reference current $I_{REF18}$ of current mirror 11. In other words, transition voltages $V_{TR+}$ and $V_{TR-}$ can be controlled without any first order dependence on the absolute sheet resistance of resistor 37.

The gate-source voltages of transistors 34, 36, and 38 can be matched by ratioing their width to length (W/L) ratios to the ratios of their currents at the transition voltages $V_{TR+}$ and $V_{TR-}$. In other words, $(W/L)_{36}$ is set equal to $(W/L)_{34} * (I_{36}/I_{34})$ and $(W/L)_{38}$ is equal to $(W/L)_{34} * (I38/I34)$, where currents $I_{34}$, $I_{36}$, and $I_{38}$ are determined in accordance with the desired threshold points, $V_{TR+}$ and $V_{TR-}$.

Figure 2:
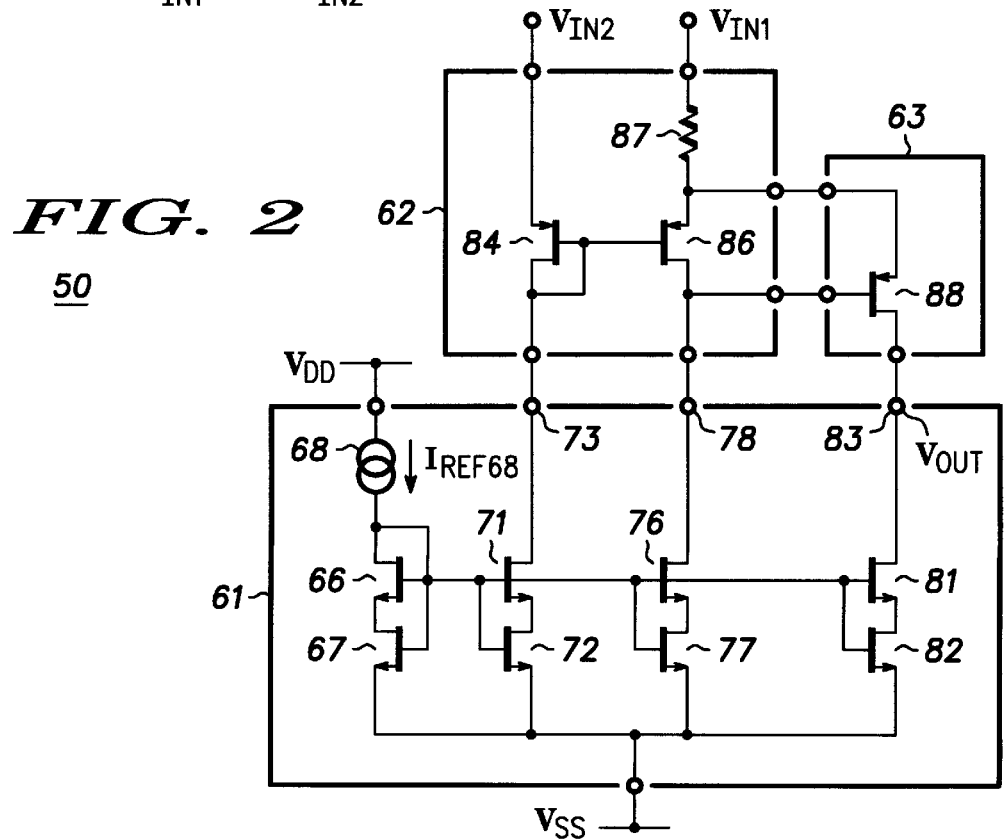
FIG. 2 is a schematic diagram of a comparator circuit in accordance with a second embodiment of the present invention.

FIG. 2 is a schematic diagram of a comparator circuit 50 in accordance with a second embodiment of the present invention. Comparator circuit 50 includes a current mirror 61 connected to a common control-electrode differential pair 62 and to a feedback circuit 63. In accordance with the second embodiment of the present invention, current mirror 61 includes four pairs of cascode connected insulated gate field effect transistors. The first pair of cascode connected transistors is comprised of N-channel insulated gate field effect transistors 66 and 67. The gate electrodes of transistors 66 and 67 are commonly connected to each other and to the drain electrode of transistor 66. The drain electrode of transistor 66 is also coupled to a source of operating potential, such as, for example, $V_{DD}$, via a current source 68. In addition, the source electrode of transistor 66 is connected to the drain electrode of transistor 67. The source electrode of transistor 67 is coupled for receiving a source of operating potential such as for example, a voltage $V_{SS}$. Current source 68 supplies a current indicated by the arrow labeled $I_{REF68}$. It should be understood that the gate electrode of a field effect transistor is also referred to as a control electrode and the source and drain electrodes are also referred to as current carrying electrodes.

The second pair of cascode connected transistors is comprised of N-channel insulated gate field effect transistors 71 and 72. The gate electrodes of transistors 71 and 72 are commonly connected to each other and to the gate electrodes of transistors 66 and 67. The drain electrode of transistor 71 is connected to an output terminal 73 of current mirror 61. The source electrode of transistor 71 is connected to the drain electrode of transistor 72 and the source electrode of transistor 72 is coupled for receiving a source of operating potential such as, for example, $V_{SS}$.

The third pair of cascode connected transistors is comprised of N-channel insulated gate field effect transistors 76 and 77. The gate electrodes of transistors 76 and 77 are commonly connected to each other and to the gate electrodes of transistors 66, 67, 71 and 72. The drain electrode of transistor 76 is connected to an output terminal 78 of current mirror 61. The source electrode of transistor 76 is connected to the drain electrode of transistor 77 and the source electrode of transistor 77 is coupled for receiving a source of operating potential, such as, for example, $V_{SS}$.

The fourth pair of cascode connected transistors is comprised of N-channel insulated gate field effect transistors 81 and 82. The gate electrodes of transistors 81 and 82 are commonly connected to each other and to the gate electrodes of transistors 66, 67, 71, 72, 76, and 77. The drain electrode of transistor 81 is connected to an output terminal 83 of current mirror 61. The source electrode of transistor 81 is connected to the drain electrode of transistor 82 and the source electrode of transistor 82 is coupled for receiving a source of operating potential such as, for example, $V_{SS}$. Although the source electrodes of transistors 67, 72, 77, and 82 are described as being coupled for receiving a source of operating potential, preferably, the source electrodes of transistors 67, 72, 77, and 82 are commonly coupled together and for receiving a potential from the same source of operating potential.

The common control-electrode differential pair 62 portion of comparator circuit 50 includes P-channel enhancement mode insulated gate field effect transistors 84 and 86 whose gate electrodes are commonly connected to each other. Because the gate electrodes of transistors 84 and 86 are commonly connected to each other, the circuit is also referred to as a common-gate differential pair. Transistor 84 is connected in a diode configuration, wherein its gate electrode is connected to its drain electrode. The commonly connected gate and drain electrodes of transistor 84 are connected to current mirror output terminal 73. The source electrode of transistor 84 is coupled for receiving a first input signal, $V_{IN1}$.

The drain electrode of transistor 86 is connected to current mirror output terminal 78. The source electrode of transistor 86 is connected to a first terminal of a resistor 87. The second terminal of resistor 87 is coupled for receiving a second input signal $V_{IN2}$.

Feedback circuit 63 is comprised of a P-channel enhancement mode field effect transistor 88. The drain electrode of transistor 88 is connected to current mirror output electrode 83 and the source electrode is commonly connected to the source electrode of transistor 86 and to the first terminal of resistor 87. The gate electrode of transistor 88 is commonly connected to current mirror output terminal 78 and to the drain electrode of transistor 86.

The operation of comparator 50 is similar to that of comparator 10. Likewise, current mirror 61 has the same advantages as current mirror 11.

Figure 3:
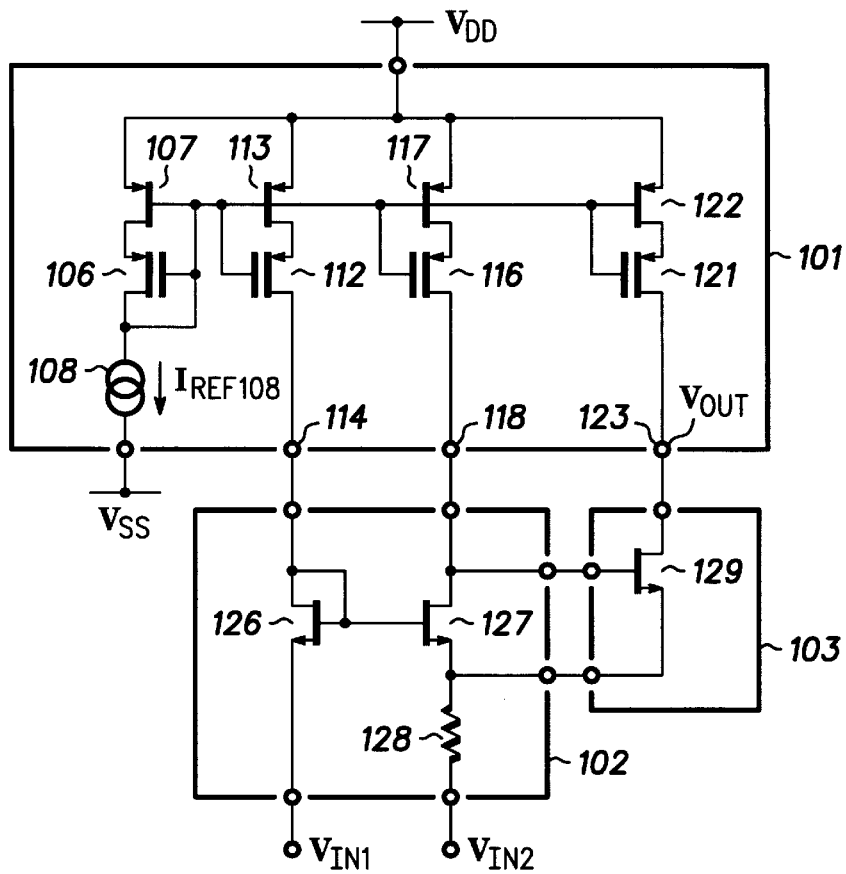
FIG. 3 is a schematic diagram of a comparator circuit in accordance with a third embodiment of the present invention.

FIG. 3 is a schematic diagram of a comparator circuit 100 in accordance with a third embodiment of the present invention. Comparator circuit 100 includes a current mirror 101 connected to a common control-electrode differential pair 102 and to a feedback circuit 103. In accordance with the third embodiment of the present invention, current mirror 101 includes four pairs of cascode connected insulated gate field effect transistors. The first pair of cascode connected transistors is comprised of a P-channel depletion mode insulated gate field effect transistor 106 and a P-channel enhancement mode insulated gate field effect transistor 107. It should be noted that if a dual threshold process is available, P-channel depletion mode insulated gate field effect transistor 106 can be a P-channel enhancement mode insulated gate field effect transistor having a threshold voltage that is at least 150 millivolts less than the threshold voltage of transistor 107 to allow both transistors 106 and 107 to operate in the saturation region. The gate electrodes of transistors 106 and 107 are commonly connected to each other and to the drain electrode of transistor 106. The drain electrode of transistor 106 is coupled to a source of operating potential such as, for example, $V_{SS}$, via a current source 108. In addition, the source electrode of transistor 106 is connected to the drain electrode of transistor 107. The source electrode of transistor 107 is coupled for receiving a source of operating potential such as, for example, a voltage $V_{DD}$. Current source 108 supplies a current indicated by the arrow labeled $I_{REF18}$. It should be understood that the gate electrode of a field effect transistor is also referred to as a control electrode and the source and drain electrodes are also referred to as current carrying electrodes.

The second pair of cascode connected transistors is comprised of a P-channel depletion mode insulated gate field effect transistor 112 and a P-channel enhancement mode insulated gate field effect transistor 113. It should be noted that if a dual threshold process is available, P-channel depletion mode insulated gate field effect transistor 112 can be a P-channel enhancement mode insulated gate field effect transistor having a threshold voltage that is at least 150 millivolts less than the threshold voltage of transistor 113 to allow both transistors 112 and 113 to operate in the saturation region. The gate electrodes of transistors 112 and 113 are commonly connected to each other and to the gate electrodes of transistors 106 and 107. The drain electrode of transistor 112 is connected to an output terminal 114 of current mirror 101. The source electrode of transistor 112 is connected to the drain electrode of transistor 113 and the source electrode of transistor 113 is coupled for receiving a source of operating potential such as, for example, $V_{DD}$.

The third pair of cascode connected transistors is comprised of a P-channel depletion mode insulated gate field effect transistor 116 and a P-channel enhancement mode insulated gate field effect transistor 117. It should be noted that if a dual threshold process is available, P-channel depletion mode insulated gate field effect transistor 116 can be a P-channel enhancement mode insulated gate field effect transistor having a threshold voltage that is at least 150 millivolts less than the threshold voltage of transistor 117 to allow both transistors 116 and 117 to operate in the saturation region. The gate electrodes of transistors 116 and 117 are commonly connected to each other and to the gate electrodes of transistors 106, 107, 112, and 113. The drain electrode of transistor 116 is connected to an output terminal 118 of current mirror 101. The source electrode of transistor 116 is connected to the drain electrode of transistor 117 and the source electrode of transistor 117 is coupled for receiving a source of operating potential such as, for example, $V_{DD}$.

The fourth pair of cascode connected transistors is comprised of a P-channel depletion mode insulated gate field effect transistor 121 and a P-channel enhancement mode insulated gate field effect transistor 122. It should be noted that if a dual threshold process is available, P-channel depletion mode insulated gate field effect transistor 121 can be a P-channel enhancement mode insulated gate field effect transistor having a threshold voltage that is at least 150 millivolts less than the threshold voltage of transistor 122 to allow both transistors 121 and 122 to operate in the saturation region. The gate electrodes of transistors 121 and 122 are commonly connected to each other and to the gate electrodes of transistors 106, 107, 112, 113, 116, and 117. The drain electrode of transistor 121 is connected to an output terminal 123 of current mirror 101. The source electrode of transistor 121 is connected to the drain electrode of transistor 122 and the source electrode of transistor 122 is coupled for receiving a source of operating potential such as, for example, $V_{DD}$. Although the source electrodes of transistors 107, 113, 117, and 122 are described as being coupled for receiving a source of operating potential, preferably, the source electrodes of transistors 107, 113, 117, and 122 are commonly coupled together and for receiving a potential from the same source of operating potential.

The common control-electrode differential pair 102 portion of comparator circuit 100 includes N-channel enhancement mode insulated gate field effect transistors 126 and 127 whose gate electrodes are commonly connected to each other. Because the gate electrodes of transistors 126 and 127 are commonly connected to each other, the circuit is also referred to as a common-gate differential pair. Transistor 126 is connected in a diode configuration, wherein its gate electrode is connected to its drain electrode. The commonly connected gate and drain electrodes of transistor 126 are connected to current mirror output terminal 114. The source electrode of transistor 126 is coupled for receiving a first input signal, $V_{IN1}$.

The drain electrode of transistor 127 is connected to current mirror output terminal 118. The source electrode of transistor 127 is connected to a first terminal of a resistor 128. The second terminal of resistor 128 is coupled for receiving a second input signal $V_{IN2}$.

Feedback circuit 103 is comprised of an N-channel enhancement mode field effect transistor 129. The drain electrode of transistor 129 is connected to current mirror output electrode 123 and the source electrode is commonly connected to the source electrode of transistor 127 and to the first terminal of resistor 128. The gate electrode of transistor 129 is commonly connected to current mirror output terminal 118 and to the drain electrode of transistor 127.

The operation of comparator 100 is similar to that of comparators 10 and 50. Likewise, current mirror 101 has the same advantages as current mirrors 11 and 61.

Figure 4:
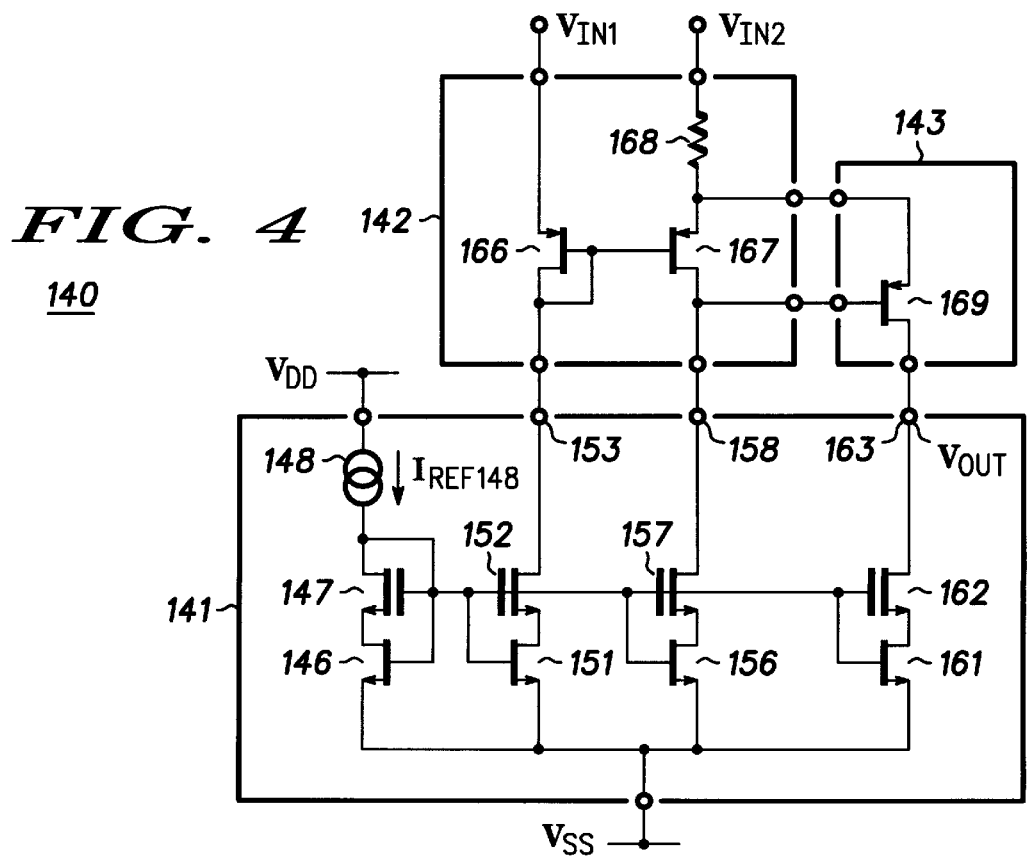
FIG. 4 is a schematic diagram of a comparator circuit in accordance with a fourth embodiment of the present invention.

FIG. 4 is a schematic diagram of a comparator circuit 140 in accordance with a fourth embodiment of the present invention. Comparator circuit 140 includes a current mirror 141 connected to a common control-electrode differential pair 142 and to a feedback circuit 143. In accordance with the fourth embodiment of the present invention, current mirror 141 includes four pairs of cascode connected insulated gate field effect transistors. The first pair of cascode connected transistors is comprised of an N-channel depletion mode insulated gate field effect transistor 147 and an N-channel enhancement mode insulated gate field effect transistor 146. It should be noted that if a dual threshold process is available, N-channel depletion mode insulated gate field effect transistor 147 can be an N-channel enhancement mode insulated gate field effect transistor having a threshold voltage that is at least 150 millivolts less than the threshold voltage of transistor 146 to allow both transistors 146 and 147 to operate in the saturation region. The gate electrodes of transistors 146 and 147 are commonly connected to each other and to the drain electrode of transistor 147. The drain electrode of transistor 147 is also coupled to a source of operating potential such as, for example, $V_{DD}$, via a current source 148. In addition, the source electrode of transistor 147 is connected to the drain electrode of transistor 146. The source electrode of transistor 146 is coupled for receiving a source of operating potential such as for example, a voltage $V_{SS}$. Current source 148 supplies a current indicated by the arrow labeled $I_{REF148}$. It should be understood that the gate electrode of a field effect transistor is also referred to as a control electrode and the source and drain electrodes are also referred to as current carrying electrodes.

The second pair of cascode connected transistors is comprised of an N-channel depletion mode insulated gate field effect transistor 152 and an N-channel enhancement mode insulated gate field effect transistor 151. It should be noted that if a dual threshold process is available, N-channel depletion mode insulated gate field effect transistor 152 can be an N-channel enhancement mode insulated gate field effect transistor having a threshold voltage that is at least 150 millivolts less than the threshold voltage of transistor 151 to allow both transistors 151 and 152 to operate in the saturation region. The gate electrodes of transistors 151 and 152 are commonly connected to each other and to the gate electrodes of transistors 146 and 147. The drain electrode of transistor 152 is connected to an output terminal 153 of current mirror 141. The source electrode of transistor 152 is connected to the drain electrode of transistor 151 and the source electrode of transistor 151 is coupled for receiving a source of operating potential $V_{SS}$.

The third pair of cascode connected transistors is comprised of an N-channel depletion mode insulated gate field effect transistor 157 and an N-channel enhancement mode insulated gate field effect transistor 156. It should be noted that if a dual threshold process is available, N-channel depletion mode insulated gate field effect transistor 157 can be an N-channel enhancement mode insulated gate field effect transistor having a threshold voltage that is at least 150 millivolts less than the threshold voltage of transistor 156 to allow both transistors 156 and 157 to operate in the saturation region. The gate electrodes of transistors 157 and 156 are commonly connected to each other and to the gate electrodes of transistors 146, 147, 151, and 152. The drain electrode of transistor 157 is connected to an output terminal 158 of current mirror 141. The source electrode of transistor 157 is connected to the drain electrode of transistor 156 and the source electrode of transistor 156 is coupled for receiving a source of operating potential such as, for example, $V_{SS}$.

The fourth pair of cascode connected transistors is comprised of an N-channel depletion mode insulated gate field effect transistor 162 and an N-channel enhancement mode insulated gate field effect transistor 161. It should be noted that if a dual threshold process is available, N-channel depletion mode insulated gate field effect transistor 162 can be an N-channel enhancement mode insulated gate field effect transistor having a threshold voltage that is at least 150 millivolts less than the threshold voltage of transistor 161 to allow both transistors 161 and 162 to operate in the saturation region. The gate electrodes of transistors 161 and 162 are commonly connected to each other and to the gate electrodes of transistors 146, 147, 151, 152, 156, and 157. The drain electrode of transistor 162 is connected to an output terminal 163 of current mirror 141. The source electrode of transistor 162 is connected to the drain electrode of transistor 161 and the source electrode of transistor 161 is coupled for receiving a source of operating potential such as, for example, $V_{SS}$. Although the source electrodes of transistors 146, 151, 156, and 161 are described as being coupled for receiving a source of operating potential, preferably, the source electrodes of transistors 146, 151, 156, and 161 are commonly coupled together and for receiving a potential from the same source of operating potential.

The common control-electrode differential pair 142 portion of comparator circuit 140 includes P-channel enhancement mode insulated gate field effect transistors 166 and 167 whose gate electrodes are commonly connected to each other. Because the gate electrodes of transistors 166 and 167 are commonly connected to each other, the circuit is also referred to as a common-gate differential pair. Transistor 166 is connected in a diode configuration, wherein its gate electrode is connected to its drain electrode. The commonly connected gate and drain electrodes of transistor 166 are connected to current mirror output terminal 153. The source electrode of transistor 166 is coupled for receiving a first input signal, $V_{IN1}$.

The drain electrode of transistor 167 is connected to current mirror output terminal 158. The source electrode of transistor 167 is connected to a first terminal of a resistor 168. The second terminal of resistor 168 is coupled for receiving a second input signal $V_{IN2}$. Feedback circuit 143 is comprised of a P-channel enhancement mode field effect transistor 169. The drain electrode of transistor 169 is connected to current mirror output electrode 163 and the source electrode is commonly connected to the source electrode of transistor 167 and to the first terminal of resistor 168. The gate electrode of transistor 169 is commonly connected to current mirror output terminal 158 and to the drain electrode of transistor 167.

The operation of comparator 140 is similar to that of comparators 10, 50, and 100. Likewise, current mirror 141 has the same advantages as current mirrors 11, 50, and 100.

By now it should be appreciated that a comparator circuit having hysteresis and a method of comparing input signals have been provided. The comparator circuit of the present invention has an improved noise immunity over conventional comparator circuits. In addition, the comparator circuit includes a high gain which allows fast transitioning of the output voltage and accurate setpoint control which is independent of the amount of hysteresis that is desired.

In addition, the common-gate current mirror has a higher output impedance than a conventional current mirror, which improves the power supply rejection characteristics of the current mirror. The improved power supply rejection characteristics also improve the setpoint control without sacrificing signal swing. Other advantages include compatibility with single threshold CMOS logic processes, i.e., a dual threshold voltage is not required, lower power consumption because of the absence of a cascode bias potential, and a compact, area efficient design.

What is claimed is:

1. A comparator circuit, comprising:
   a current mirroring circuit that receives a reference current and provides a first mirrored current in a first transistor, a second mirrored current in a second transistor, and a third mirrored current in a third transistor;
   a common electrode differential pair that includes fourth and fifth transistors receiving the respective first and second mirrored currents at first current conducting terminal and second current conducting terminal; and
   a feedback circuit having a first terminal coupled to the first current conducting terminal of the fifth transistor, a second terminal coupled to the second current conducting terminal of the fifth transistor, and a third terminal coupled to the third transistor for receiving the third mirrored current.

2. The comparator circuit of claim 1, wherein the feedback circuit comprises a field effect transistor having a control electrode coupled to the first terminal, a first current carrying electrode coupled to the second terminal, and a second current carrying electrode coupled to the third terminal.

3. The comparator circuit of claim 1, wherein the second current conducting terminal of the fifth transistor receives the second input signal via a resistor.

4. The comparator circuit of claim 1, wherein the first, second, third, and fourth transistors are enhancement mode field effect transistors.

5. The comparator circuit of claim 1, wherein the first, second, third, and fourth transistors are N channel field effect transistors.

6. The comparator circuit of claim 1, wherein the first, second, third, and fourth transistors are P channel field effect transistors.

7. A comparator circuit, comprising:
   a current mirror having a first transistor coupled for receiving a reference current and first, second and third cascode connected transistors coupled for providing respective first, second and third mirrored currents of the reference current;
   first and second transistors of a common electrode differential pair having first current conducting terminal coupled for receiving the first mirrored current and second current conducting terminal coupled for receiving the second mirrored current; and
   a feedback circuit having a first terminal coupled to the first current conducting terminal of the second transistor of the common electrode differential pair, a second terminal coupled for receiving the third mirrored current, and a third terminal providing a feedback signal to the second current conducting terminal of the second transistor of the common electrode differential pair.

8. The comparator circuit of claim 7, wherein the first transistor and the first, second and third cascode connected transistors have commonly coupled gates.

9. The comparator circuit of claim 7, wherein the second current conducting terminal of the first transistor of the common electrode differential pair receives a first portion of the differential signal and the second current conducting terminal of the second transistor of the common electrode differential pair receives a second portion of the differential signal through a resistor.

10. The comparator circuit of claim 7, wherein the feedback circuit comprises a field effect transistor having a first current carrying electrode coupled to the second terminal, a second current carrying electrode coupled to the third terminal, and a control electrode coupled to the first terminal.

11. A current mirror, comprising:
   a first field effect transistor having a gate electrode, a source electrode, and a drain electrode;
   a second field effect transistor having a gate electrode commonly coupled to the gate electrode of the first field effect transistor, a source electrode coupled to the drain electrode of the first field effect transistor, and a drain electrode commonly coupled to the gate electrode of the second field effect transistor;
   a third field effect transistor having a gate electrode coupled to the gate electrodes of the first and second field effect transistors and a source electrode coupled to the source electrode of the first field effect transistor;
   a fourth field effect transistor having a gate electrode coupled to the gate electrodes of the first, second, and third field effect transistors and a source electrode coupled to the drain electrode of the third field effect transistor; and wherein
      the first, second, third, and fourth field effect transistors have a same threshold voltage.

12. The current mirror of claim 11, wherein the first and third field effect transistors are enhancement mode field effect transistors and the second and fourth field effect transistors are depletion mode field effect transistors.

13. The current mirror of claim 11, wherein the first, second, third, and fourth field effect transistors are enhancement mode field effect transistors.

14. The current mirror of claim 11, wherein the current mirror further comprises:
   a fifth field effect transistor having a gate electrode coupled to the gate electrodes of the first, second, third, and fourth field effect transistors and a source electrode coupled to the source electrodes of the first and second field effect transistors;
   a sixth field effect transistor having a gate electrode coupled to the gate electrodes of the first, second, third, fourth, and fifth field effect transistors and a source electrode coupled to the drain electrode of the fifth field effect transistor; and wherein
      the fifth and sixth field effect transistors have the same threshold voltage as the first, second, third, and fourth field effect transistors.

15. A method for comparing input signals, comprising the steps of:
   determining a voltage difference between first and second input signals;
   generating, in response to the voltage difference being substantially zero, first and second currents;
   generating a third current in response to a voltage of the second input signal being less than a voltage of the first input signal;
   increasing the third current in response to a second voltage becoming less than a first voltage; and
   after increasing the third current, providing a first positive feedback signal to further increase the third current while reducing the second current and to change an output signal from a first logic state to a first setpoint.

16. The method of claim 15, further including the steps of:
   increasing the second voltage in response to the voltage of the second input signal becoming larger than the voltage of the first input signal;
   decreasing the third current in response to the voltage of the second input signal becoming larger than the voltage of the first input signal;
   providing a second positive feedback signal to further decrease the third current to substantially zero current while increasing the second current; and
   changing the output signal from the first setpoint to a second setpoint, wherein the first and second setpoints are substantially different.

17. The method of claim 15, further including the step of using hysteresis to set a first trip point if the output signal transitions from the first logic state to a second logic state and to set a second trip point if the output signal transitions from the second logic state to the first logic state.

* * * * *